(12) United States Patent
Kawajiri

(10) Patent No.: US 12,520,464 B2
(45) Date of Patent: Jan. 6, 2026

(54) THREE-DIMENSIONAL MOLDING MACHINE AND COMPONENT MOUNTING MACHINE

(71) Applicant: FUJI CORPORATION, Chiryu (JP)

(72) Inventor: Akihiro Kawajiri, Chiryu (JP)

(73) Assignee: FJUI CORPORATION, Chiryu (JP)

( * ) Notice: Subject to any disclaimer, the term of this patent is extended or adjusted under 35 U.S.C. 154(b) by 445 days.

(21) Appl. No.: 17/627,072

(22) PCT Filed: Jul. 16, 2019

(86) PCT No.: PCT/JP2019/027961
§ 371 (c)(1),
(2) Date: Jan. 13, 2022

(87) PCT Pub. No.: WO2021/009854
PCT Pub. Date: Jan. 21, 2021

(65) Prior Publication Data
US 2022/0274336 A1    Sep. 1, 2022

(51) Int. Cl.
*B29C 64/112* (2017.01)
*B29C 64/236* (2017.01)
(Continued)

(52) U.S. Cl.
CPC ........ *H05K 13/0061* (2013.01); *B29C 64/112* (2017.08); *B29C 64/236* (2017.08);
(Continued)

(58) Field of Classification Search
CPC ...... H05K 13/0061; H05K 3/10; H05K 3/125; H05K 13/0417; H05K 13/0452;
(Continued)

(56) References Cited

U.S. PATENT DOCUMENTS 11,014,294 B2    5/2021  Herzog
2011/0195140 A1*  8/2011  Ho ................. B29C 31/006
                                          425/185
(Continued)

FOREIGN PATENT DOCUMENTS

JP    2009-182025 A    8/2009
JP    2013-77674 A     4/2013
(Continued)

OTHER PUBLICATIONS

International Search Report mailed on Oct. 8, 2019 in PCT/JP2019/027961 filed on Jul. 16, 2019, 4 pages.

*Primary Examiner* — JaMel M Nelson
*Assistant Examiner* — Erica Hartsell Funk
(74) *Attorney, Agent, or Firm* — Oblon, McClelland, Maier & Neustadt, L.L.P.

(57) ABSTRACT

A three-dimensional molding machine includes a three-dimensional molding device configured to mold a three-dimensional molded object on a molding pallet, a circuit forming device configured to form a circuit pattern on the molded object during or after molding, a component mounting device configured to mount an electronic component on the circuit pattern formed on the molded object, a pallet conveyance device configured to convey the molded object together with the molding pallet between the three-dimensional molding device, the circuit forming device, and the
(Continued)

component mounting device, and a component conveyance device configured to the electronic components into the component mounting device from an outside of the machine.

11 Claims, 3 Drawing Sheets

(51) Int. Cl.
| | |
|---|---|
| *B29C 64/245* | (2017.01) |
| *H05K 3/10* | (2006.01) |
| *H05K 3/12* | (2006.01) |
| *H05K 13/00* | (2006.01) |
| *H05K 13/04* | (2006.01) |
| *B29L 31/34* | (2006.01) |
| *B33Y 10/00* | (2015.01) |
| *B33Y 30/00* | (2015.01) |
| *B33Y 40/00* | (2020.01) |

(52) U.S. Cl.
CPC ............ *B29C 64/245* (2017.08); *H05K 3/10* (2013.01); *H05K 3/125* (2013.01); *H05K 13/0417* (2013.01); *H05K 13/0452* (2013.01); *H05K 13/0469* (2013.01); *B29L 2031/3425* (2013.01); *B33Y 10/00* (2014.12); *B33Y 30/00* (2014.12); *B33Y 40/00* (2014.12)

(58) Field of Classification Search
CPC . H05K 13/0469; B29C 64/112; B29C 64/245; B29C 64/236; B29C 45/1468; B29C 45/0084; B29L 2031/3425
See application file for complete search history.

(56) References Cited

U.S. PATENT DOCUMENTS

2011/0302776 A1* 12/2011 Kato .................... H05K 13/085
  29/829
2017/0042034 A1   2/2017 Maccurdy et al.

FOREIGN PATENT DOCUMENTS

| JP | 2014-175331 A | 9/2014 |
| JP | 2015-84388 A | 4/2015 |
| JP | 2017-130553 A | 7/2017 |
| JP | 2018-525523 A | 9/2018 |
| JP | 2018-182050 A | 11/2018 |
| JP | 2019-111776 A | 7/2019 |
| WO | WO 2018/134873 A1 | 7/2018 |
| WO | WO 2018/138978 A1 | 8/2018 |
| WO | WO 2019/102522 A1 | 5/2019 |
| WO | WO 2019/133708 A1 | 7/2019 |

* cited by examiner

THREE-DIMENSIONAL MOLDING MACHINE AND COMPONENT MOUNTING MACHINE

TECHNICAL FIELD

The present specification relates to a three-dimensional molding machine for manufacturing a molded object including an electronic circuit, and a component mounting machine that can be incorporated in the three-dimensional molding machine.

BACKGROUND ART

Techniques for manufacturing a substrate product by mounting electronic components on a substrate on which a circuit pattern is formed have become widespread. Conventionally, substrates have been manufactured by a method that combines metal plating and etching process. In addition, mounting of the electronic component has been performed by a component mounting line in which a solder printer, a component mounting machine, and the like are combined. In recent years, a technique for manufacturing a substrate using a three-dimensional molding technique has been put into practical use, one technical example of which is disclosed in Patent Literature 1. The component mounting machine uses a tray in which electronic components are arranged or a carrier tape in which electronic components are accommodated in multiple cavities. One technical example of a component mounting machine using a tray is disclosed in Patent Literature 2.

Patent Literature 1 discloses a method of manufacturing a circuit board including a layer forming step of forming a layer in the thickness direction of a circuit board using multiple three-dimensional molding materials including a material of an insulator and a material of a conductor based on molding data of a layer included in three-dimensional molding data, a curing step of curing the three-dimensional molding material of the formed layer, and repeating the layer forming step and the curing step. As a result, a circuit board including a substrate portion, a pattern for a power supply circuit, a pattern for a functional circuit, a transformer, a connecting section for a transformer, and an inter-circuit connecting section is manufactured.

Patent Literature 2 discloses a method of mounting electronic components in a component mounting machine including multiple rows of substrate conveyance lanes and a mounting head for picking up and mounting components on a substrate, the method including a step of conveying a tray accommodating tray supply components to one substrate conveyance lane, and a step of mounting the tray supply components on a substrate conveyed by another substrate conveyance lane. According to this, it is said that a component supplying device dedicated to the tray supply component having a high facility cost is not necessary, and thus, the facility cost can be reduced.

PATENT LITERATURE

Patent Literature 1: Japanese Patent Publication No. 2018-182050
Patent Literature 2: Japanese Patent Publication No. 2009-182025

BRIEF SUMMARY

Technical Problem

Incidentally, Patent Literature 1 is a technique of a method of manufacturing a substrate using three-dimensional molding, and mounting of electronic components is performed by another device. Therefore, according to the technique of Patent Literature 1, it is impossible to manufacture a molded object including an electronic circuit on which an electronic component is mounted. In addition, in a general three-dimensional molding machine, although electronic components can be manually mounted on a molded object during molding, production efficiency is remarkably low.

Meanwhile, in Patent Literature 2, when there are multiple types of tray supply components to be mounted on a substrate, since an operation of replacing trays in one substrate conveyance lane is required for each substrate, the production efficiency is also low. This problem is also common to the conventional art in which a tray is selectively pulled out from a multi-stage tray unit accommodating multiple trays and used. Further, even when the techniques of Patent Literature 1 and Patent Literature 2 are combined in order to manufacture a molded object including an electronic circuit, the problem of low production efficiency is not eliminated.

The present specification provides a three-dimensional molding machine capable of manufacturing a molded object including an electronic circuit with high production efficiency, and a component mounting machine capable of efficiently supplying multiple types of electronic components from one component pallet and being incorporated into the three-dimensional molding machine.

Solution to Problem

According to the present specification, there is provided a three-dimensional molding machine including: a three-dimensional molding device configured to mold a three-dimensional molded object on a molding pallet; a circuit forming device configured to form a circuit pattern on the molded object during or after molding; a component mounting device configured to mount an electronic component on the circuit pattern formed on the molded object; a pallet conveyance device configured to convey the molded object together with the molding pallet between the three-dimensional molding device, the circuit forming device, and the component mounting device; and a component conveyance device configured to the electronic components into the component mounting device from an outside of the machine.

In addition, according to the present specification, there is provided a component mounting machine including: a target object conveyance device configured to in and out a mounting target object on which a circuit pattern is formed; a component conveyance device configured to in a component pallet on which multiple component trays configured to hold multiple types of electronic components for each type are placed; and a component transferring device configured to collect the electronic components from the component tray conveyed in by the component conveyance device, and mount the electronic components on the circuit pattern of the mounting target object conveyed in by the target object conveyance device.

Advantageous Effects

According to a three-dimensional molding machine disclosed in the present specification, molding of a molded object, formation of a circuit pattern, and mounting of electronic components are performed by each device in the machine, and conveyance of the molded object between the devices and -in of electronic components from the outside of the machine are performed using two sets of conveyance devices. Accordingly, it is possible to manufacture the molded object including an electronic circuit with high production efficiency without requiring a great deal of effort.

In addition, according to a component mounting machine disclosed in the present specification, a component pallet on which multiple component trays configured to hold multiple types of electronic components for each type are placed is used. Therefore, the replacement of the component tray or the component pallet may be performed only when the component runs out, and thus, multiple types of electronic components can be efficiently supplied from one component pallet. This component mounting machine can be incorporated in the three-dimensional molding machine described above. In addition, the component mounting machine may be configured separately from the three-dimensional molding machine by using a thin plate-shaped substrate or the like on which a circuit pattern is formed as a mounting target object.

DESCRIPTION OF EMBODIMENTS

Figure 1:
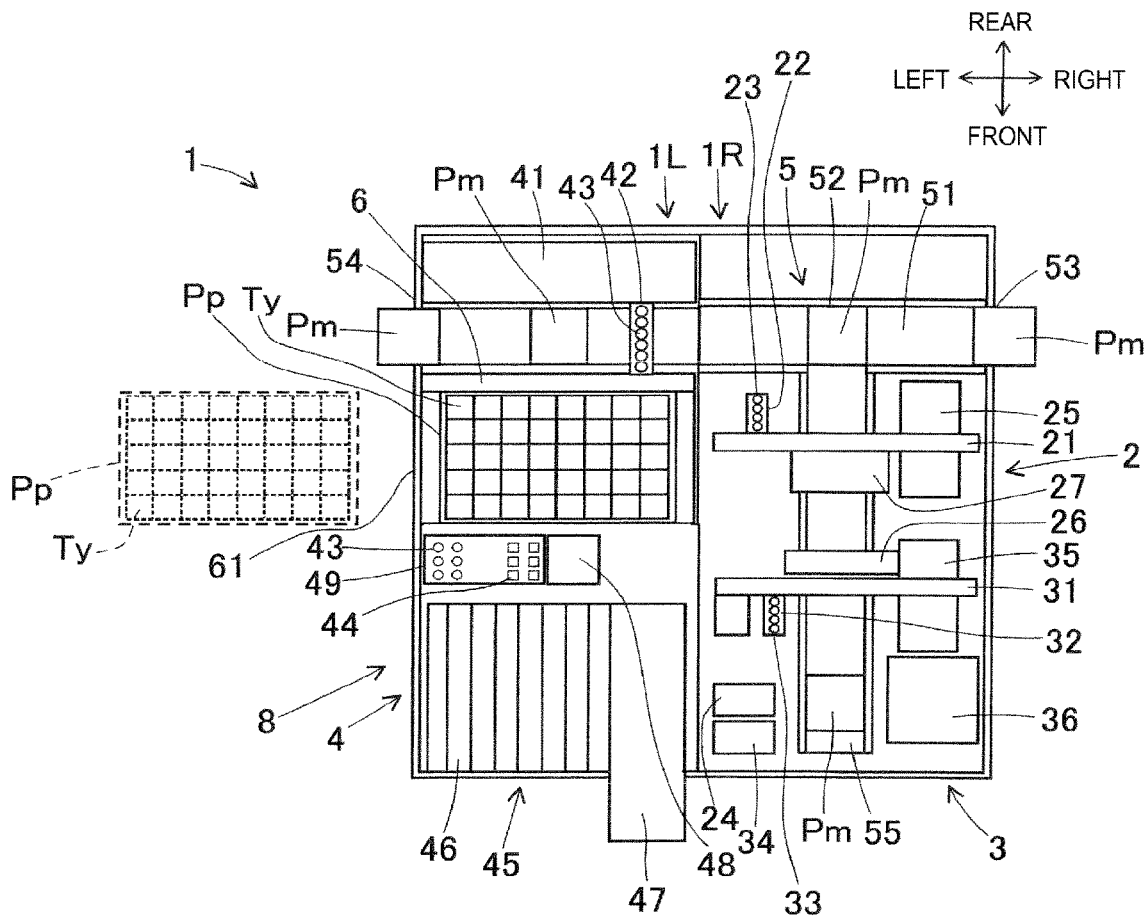
FIG. 1 is a plan view showing a configuration example of a three-dimensional molding machine according to an embodiment.

1. Configuration Example of Three-Dimensional Molding Machine 1 According to Embodiment First, a configuration example of three-dimensional molding machine 1 according to an embodiment will be described. Three-dimensional molding machine 1 manufactures a molded object having a three-dimensional shape including an electronic circuit. In a plan view of FIG. 1, front, rear, left, and right of three-dimensional molding machine 1 are determined for convenience. Three-dimensional molding machine 1 is configured by integrating molding block 1R on a right side and mounting block 1L on a left side. Three-dimensional molding machine 1 includes three-dimensional molding device 2, circuit forming device 3, component mounting device 4, pallet conveyance device 5, component conveyance device 6, and control device (not shown). A shape of the molded object to be manufactured is defined by the three-dimensional shape data. The three-dimensional shape data includes multiple two-dimensional layer data defining a shape at a pitch of a predetermined minute height dimension.

Three-dimensional molding device 2 is disposed at a rear portion of molding block 1R. Circuit forming device 3 is disposed in a front portion of molding block 1R. Component mounting device 4 occupies a large portion of mounting block 1L. Pallet conveyance device 5 includes left-right conveyance unit 51 and front-rear conveyance unit 55. Pallet conveyance device 5 conveys the molded object together with molding pallet Pm between three-dimensional molding device 2, circuit forming device 3, and component mounting device 4.

Left-right conveyance unit 51 is disposed behind three-dimensional molding device 2 in molding block 1R and through a rear portion of component mounting device 4 in mounting block 1L. Left-right conveyance unit 51 includes branching portion 52 in molding block 1R. In addition, left-right conveyance unit 51 has -in end 53 opened toward the right of molding block 1R, and -out end 54 opened toward the left of mounting block 1L.

Left-right conveyance unit 51 conveys in molding pallet Pm into the machine from -in end 53, and conveys molding pallet Pm to branching portion 52. In addition, left-right conveyance unit 51 can convey molding pallet Pm from branching portion 52 to the work position of component mounting device 4, as well as convey molding pallet Pm in the opposite direction. Further, left-right conveyance unit 51 conveys molding pallet Pm from the work position of component mounting device 4 to convey-out end 54, and carries out molding pallet Pm to the outside of the machine.

Front-rear conveyance unit 55 is disposed to be branched from branching portion 52 into a T-shape. Front-rear conveyance unit 55 extends in a front-rear direction substantially through the center in a left-right direction of three-dimensional molding device 2 and circuit forming device 3. Front-rear conveyance unit 55 receives molding pallet Pm located in branching portion 52, and conveys molding pallet Pm to the work position of three-dimensional molding device 2 and the work position of circuit forming device 3. Front-rear conveyance unit 55 returns molding pallet Pm to branching portion 52 from the work position of three-dimensional molding device 2 and the work position of circuit forming device 3.

Each of left-right conveyance unit 51 and front-rear conveyance unit 55 is configured by using a conveyor device having a conveyor belt that rotates. In FIG. 1, molding pallet Pm is shown at each of -in end 53, branching portion 52, the work position of circuit forming device 3, work position of component mounting device 4, and -out end 54. It should be noted that pallet conveyance device 5 may have a configuration other than the conveyor device, for example, a configuration which holds and moves molding pallet Pm using a robot hand.

Component conveyance device 6 is disposed at a position ahead of left-right conveyance unit 51 in mounting block 1L so as to be parallel to left-right conveyance unit 51. Component conveyance device 6 has -in/out port 61 opened in a left surface of mounting block 1L. Component conveyance device 6 conveys the electronic component into component mounting device 4 from the outside of the machine. Specifically, component conveyance device 6 conveys component pallet Pp on which multiple component trays Ty are placed into component mounting device 4 from -in/out port 61.

As shown in FIG. 1, 40 component trays Ty are disposed in 5 rows and 8 columns on the upper side of component pallet Pp. Each component tray Ty holds multiple electronic components for each type. In each component tray Ty, multiple electronic components are arranged in a two-dimensional lattice pattern. Accordingly, component pallet Pp can supply multiple electronic components of up to 40 types. In addition, in a case where the number of electronic components used differs depending on the type of electronic component, electronic components of a type in which the number of electronic components used is large are held in multiple component trays Ty.

As the manufacture of the molded object progresses, any type of electronic component runs out. At this time, component conveyance device 6 conveys out a portion of component pallet Pp so that the portion protrudes from -in/out port 61 to the outside of the machine, and communicates the same to an operator. The operator can pull out component pallet Pp to the outside position (indicated by dashed lines) of the machine. In the outside position of the machine, the operator exchanges component tray Ty of which the components run out with a new tray to provide the electronic components. Alternatively, the operator exchanges component pallet Pp at the outside position of the machine with another component pallet Pp to collectively exchange all component trays Ty. Thereafter, the operator inserts a portion of component pallet Pp into component conveyance device 6 from -in/out port 61. Then, component conveyance device 6 re-conveys in component pallet Pp.

Since the -out and re-in of component pallet Pp occur when multiple electronic components held in component tray Ty are consumed, the frequency of the occurrence is low. Accordingly, it does not take a great deal of effort to provide the components. In addition, since the exchange of component tray Ty and component pallet Pp is performed at the outside position of the machine, efficiency of the exchange is high, and the exchange is easily performed in a short time. In addition, when exchange component pallet Pp, multiple types of electronic components can be provided at once.

Component conveyance device 6 is configured by a conveyor device having a conveyor belt that rotates. However, component pallet Pp is formed to be larger in size than molding pallet Pm so as to be adapted to the use for in multiple types of electronic components. Therefore, a width dimension of the conveyor belt of component conveyance device 6, a driving source of the conveyor belt, and other structural materials are larger than those of pallet conveyance device 5.

It should be noted that a pallet operating device can be disposed in the vicinity of -in/out port 61 of component conveyance device 6 to automate the -in/out of component pallet Pp. The pallet operating device includes, for example, a receiving section for receiving component pallet Pp from component conveyance device 6, and a selection section for selecting one of multiple component pallets Pp and transferring selected component pallet to component conveyance device 6.

Three-dimensional molding device 2 molds a three-dimensional molded object on molding pallet Pm. Three-dimensional molding device 2 includes gantry 21, molding head 22, molding nozzle 23, ink tank 24, maintenance section 25, smoothing unit 26, ultraviolet ray irradiating unit 27, and the like. Three-dimensional molding device 2 uses, as a raw material, a molding ink containing a polymerizable compound that is polymerized and solidified by irradiation with ultraviolet ray.

Gantry 21 is a gate-type structure that straddles front-rear conveyance unit 55. A horizontal portion of gantry 21 extending in the left-right direction is disposed at a height exceeding the height dimension of the molded object with respect to front-rear conveyance unit 55. Molding head 22 is mounted on the horizontal portion of gantry 21 and moves in the left-right direction. Multiple molding nozzles 23 are provided below molding head 22 so as to be aligned in a row in the front-rear direction. Multiple molding nozzles 23 have a function of individually switching the ejection and stoppage of the molding ink. The molding ink is stored in ink tank 24 disposed on the left of a front portion of molding block 1R, and is supplied to molding nozzle 23 using a tube (not shown).

Prior to the molding operation using molding head 22 and molding nozzle 23, molding pallet Pm is conveyed into the work position below gantry 21. In conjunction with the movement of molding head 22 in the left-right direction, molding nozzle 23 performs a molding operation for individually switching the ejection and stop of the molding ink. As a result, a layer shape of the molding ink is formed on molding pallet Pm. The layer shape coincides with the shape of the molded object defined in the layer data.

It should be noted that in a case where the molding width dimension that can be molded by multiple molding nozzles 23 is insufficient with respect to the size of the molded object, multiple molding operations are performed. Specifically, front-rear conveyance unit 55 operates after a first molding operation to change the position of molding pallet Pm in the front-rear direction. Subsequently, a second molding operation is performed, so that a range of the molded object that was not molded in the first molding operation is molded. In this manner, the molding operation and the positional change of molding pallet Pm are repeated to mold the entire layer shape of the molded object.

Molding pallet Pm in which the layer shape is molded is conveyed to a work position below smoothing unit 26 by front-rear conveyance unit 55. It should be noted that molding head 22 and molding nozzle 23 may be fixed above front-rear conveyance unit 55, and thus, the molding operation in which molding pallet Pm moves in the front-rear direction may be performed by the conveyance of front-rear conveyance unit 55.

Maintenance section 25 is provided at a position on the right of front-rear conveyance unit 55 and below gantry 21. Molding head 22 and molding nozzle 23 move to maintenance section 25 as required, and receive maintenance from maintenance section 25. As the maintenance content of maintenance section 25, cleaning for wiping the distal end of molding nozzle 23, purging of the molding ink by applying pressure to molding nozzle 23, or the like is performed.

Smoothing unit 26 is provided so as to be movable up or down at a position apart from gantry 21 ahead of gantry 21. Smoothing unit 26 is moved down to the height of the layer shape on conveyed-in molding pallet Pm to smooth the surface of the liquid layer shape. As a result, the height of the layer shape is made uniform and adjusted to a predetermined minute height dimension. Thereafter, molding pallet Pm is conveyed to a work position below ultraviolet ray irradiating unit 27 by front-rear conveyance unit 55.

Ultraviolet ray irradiating unit 27 is provided to be movable up or down at a position ahead of gantry 21. Ultraviolet ray irradiating unit 27 is moved down until it approaches the layer shape on the conveyed-in molding pallet Pm, and irradiates the layer shape with ultraviolet ray. As a result, the polymerizable compound in the molding ink is polymerized and solidified, and thus, the layer shape is solidified.

Molding head 22, molding nozzle 23, smoothing unit 26, and ultraviolet ray irradiating unit 27 can be operated repeatedly in this order. In the second and subsequent operations, the liquid layer shape is formed so as to overlap with the upper side of the solid layer shape and is solidified. As a result, the height of the molded object during the molding increases by the minute height dimension. Thereafter, molding pallet Pm is conveyed by pallet conveyance device 5 to any of a lower work position of gantry 21, a work position of circuit forming device 3, and a work position of component mounting device 4 corresponding to the content of the next process.

Circuit forming device 3 forms a circuit pattern on a molded object during or after the molding. Circuit forming device 3 is a drawing device that draws a circuit pattern on a molded object using a conductive ink in which metallic fine particles such as silver are mixed in a solvent. Circuit forming device 3 includes gantry 31, drawing head 32, inkjet nozzle 33, cleaning liquid tank 34, maintenance section 35, firing unit 36, and the like.

Gantry 31 is a gate-type structure that straddles front-rear conveyance unit 55. The horizontal portion of gantry 31 extending in the left-right direction is disposed at a height exceeding the height dimension of the molded object with respect to front-rear conveyance unit 55. Drawing head 32 is mounted on a horizontal portion of gantry 31 and moves in the left-right direction. Multiple inkjet nozzles 33 are provided below drawing head 32 so as to be aligned in a row in the front-rear direction. Multiple inkjet nozzles 33 have a function of individually switching the ejection and stoppage of the conductive ink.

Prior to the drawing operation, drawing head 32 and inkjet nozzle 33 move to maintenance section 35. Maintenance section 35 is provided at a position on the right of front-rear conveyance unit 55 and below gantry 31. In maintenance section 35, the operator performs a provision operation for providing the conductive ink to inkjet nozzle 33.

Here, since the conductive ink has a relatively short usable period, it may be discarded. In this case, the cleaning liquid stored in cleaning liquid tank 34 on the front side of ink tank 24 is supplied to inkjet nozzle 33 using a tube (not shown). As a result, the interior of inkjet nozzle 33 is cleaned. In addition, inkjet nozzle 33 is kept in a state filled with the cleaning liquid, and thus, the clean state is maintained until the next provision operation.

Prior to the drawing operation, molding pallet Pm on which the molded object is placed during or after the molding is conveyed into the work position below gantry 31. In conjunction with the movement of drawing head 32 in the left-right direction, inkjet nozzle 33 performs the drawing operation for individually switching the ejection and stop of the conductive ink. As a result, the shape of the circuit pattern defined in the layer data is drawn.

It should be noted that in a case where the drawing width dimension that can be drawn by multiple inkjet nozzles 33 is insufficient with respect to the circuit pattern, multiple drawing operations are performed. Specifically, front-rear conveyance unit 55 operates after a first drawing operation to change the position of molding pallet Pm in the front-rear direction. Next, a second drawing operation is performed, and thus, a range of the circuit pattern not drawn in the first drawing operation is drawn. In this manner, the drawing operation and the positional change of molding pallet Pm are repeated, and thus, the entire shape of the circuit pattern is drawn. It should be noted that drawing head 32 and inkjet nozzle 33 may be fixed above front-rear conveyance unit 55, and thus, the drawing operation in which molding pallet Pm moves in the front-rear direction may be performed by the conveyance of front-rear conveyance unit 55.

Firing unit 36 is disposed on the right side of front-rear conveyance unit 55. Molding pallet Pm for which the drawing operation has been completed is conveyed by front-rear conveyance unit 55 to a work position on the left of firing unit 36. Firing unit 36 captures the molded object on which the circuit pattern is drawn from molding pallet Pm using a conveyance hand (not shown). Next, firing unit 36 heats the conductive ink to evaporate the solvent, thereby firing the circuit pattern. Next, firing unit 36 returns the molded object in which the circuit pattern is fired to the original position of molding pallet Pm using the conveyance hand. It should be noted that firing unit 36 may operate so as to capture the entire molding pallet Pm on which the molded object is placed, and to fire molding pallet Pm.

Component mounting device 4 mounts the electronic components to the circuit pattern formed on the molded object. Component mounting device 4 includes moving gantry 41, mounting head 42, feeder-type component supplying unit 45, paste supplying unit 47, component camera 48, mounting tool station 49, and the like. In addition, component pallet Pp has already been conveyed into component mounting device 4 by component conveyance device 6.

Moving gantry 41 is a gate-type moving device movable in the front-rear direction. Moving gantry 41 passes above left-right conveyance unit 51 and component conveyance device 6, and moves from approximately the front end to the rear end of mounting block 1L. Mounting head 42 is provided in moving gantry 41 and moves in the left-right direction. One or multiple component mounting tools 43 are exchangeably provided below mounting head 42. Multiple component mounting tools 43 may be disposed on a straight line as shown in FIG. 1, or may be arranged on a circumference. Examples of component mounting tool 43 include a suction nozzle and a clamping type mounting tool.

Feeder-type component supplying unit 45 is disposed on the left of a front portion of mounting block 1L. Feeder-type component supplying unit 45 is configured by arranging multiple feeder devices 46. Each feeder device 46 feeds a carrier tape holding multiple electronic components to supply the electronic components.

Paste supply unit 47 is disposed on the right of a front portion of mounting block 1L in parallel with feeder-type component supplying unit 45. Paste supply unit 47 supplies a conductive material in a paste form which electrically and mechanically connects a component mounting position of the circuit pattern and a connecting section of the electronic component. As the paste-like conductive material, a paste-like conductive adhesive having a higher viscosity than the conductive ink may be used, or molten solder may be used. Paste supply unit 47 is pulled out to the front side, and thus, provision, maintenance, adjustment, and the like of the conductive adhesive are performed.

Examples of an application work of the conductive adhesive include a first application method applied to a component mounting position of the circuit pattern and a second application method applied to a connecting section of the electronic component. In the first application method, applicator 44 for applying the conductive adhesive is held by mounting head 42. That is, mounting head 42 exchangeably holds applicator 44 and component mounting tool 43, or holds both applicator 44 and component mounting tool 43. Meanwhile, in the second application method, applicator 44 is not used. In either the first application method or the second application method, mounting head 42 plays a dual role of the application work of the conductive adhesive and the mounting work of the electronic component.

Component camera 48 is disposed ahead of component conveyance device 6. Component camera 48 captures an image of a state in which component mounting tool 43 of mounting head 42 collects the electronic component from below, and acquires the image data. The acquired image data is subjected to image processing to determine the presence or absence of electronic components and the correctness of the electronic components, as well as to determine the collection posture. These determination results are reflected to the mounting work of the electronic component.

Mounting tool station 49 is disposed on the left of the component camera 48 on the front side of component conveyance device 6. Mounting tool station 49 temporarily stores multiple types of component mounting tools 43 that can be selectively used according to the size or the like of electronic components. Mounting tool station 49 further temporarily stores applicator 44 of the conductive adhesive. Mounting head 42 moves above mounting tool station 49 so that component mounting tool 43 and applicator 44 can be automatically exchanged.

Prior to the mounting work of component mounting device 4, molding pallet Pm on which the molded object on which the circuit pattern is already formed is placed is conveyed into the work position. When the first application method of the conductive adhesive is used, mounting head 42 first moves above paste supplying unit 47 in a state where applicator 44 is held. Next, mounting head 42 lowers applicator 44 so that a lower portion thereof is immersed in the conductive adhesive to attach the conductive adhesive.

Next, mounting head 42 moves above component camera 48. Component camera 48 captures an image of applicator 44 from below to acquire image data. Acquired image data is subjected to image processing to determine whether the attached state of the conductive adhesive is acceptable. When the attached state is defective, mounting head 42 moves again above paste supplying unit 47 to perform a retry operation.

When the attached state of the conductive adhesive is good, mounting head 42 moves above the molded object in the work position. Next, mounting head 42 lowers applicator 44 to apply the conductive adhesive attached to the lower portion thereof to the component mounting position of the circuit pattern. Accordingly, the first application method of the conductive adhesive is finished.

Examples of applicator 44 include, but are not limited to, a transfer pin. The transfer pin has a transfer surface at a distal end that mimics a shape and an area to be applied to the circuit pattern. The number of transfer surfaces included in the transfer pin may be only one, or may be multiple apart from each other. When the transfer pin is lowered toward paste supplying unit 47, the transfer surface is immersed in the conductive adhesive so that the conductive adhesive is attached. Thereafter, when the transfer pin is lowered toward the circuit pattern, the transfer surface comes into contact with the component mounting position of the circuit pattern to transfer and apply the conductive adhesive.

Next, mounting head 42 moves to at least one of an upper side of feeder-type component supplying unit 45 and an upper side of component pallet Pp in a state where component mounting tool 43 is held. Next, mounting head 42 lowers component mounting tool 43 to collect electronic components from at least one of feeder device 46 and component tray Ty. Next, mounting head 42 moves above component camera 48. Component camera 48 captures an image of a state in which an electronic component is collected by component mounting tool 43 from below, and acquires image data. The acquired image data is subjected to image processing to determine the presence or absence of the electronic components, the correctness of the electronic components, and the collection posture.

When it is determined that the electronic component is defective, mounting head 42 discards the electronic component determined to be defective. When it is determined to be satisfactory, mounting head 42 moves above the molded object at the work position. Next, mounting head 42 lowers component mounting tool 43 to mount the electronic component on the conductive adhesive on the circuit pattern. Thus, the mounting work of the electronic component is finished. Mounting head 42 holding multiple component mounting tools 43 can mount electronic components equal to the number of component mounting tools 43 in one application work and one mounting work. In addition, the application work of the conductive adhesive and the mounting work of the electronic component are repeated in multiple cycles as required.

Meanwhile, when the second application method of the conductive adhesive is used, mounting head 42 moves at least one of an upper side of feeder-type component supplying unit 45 and an upper side of component pallet Pp in a state where component mounting tool 43 is held. Next, mounting head 42 lowers component mounting tool 43 to collect electronic components from at least one of feeder device 46 and component tray Ty.

Next, mounting head 42 moves to the upper side of paste supplying unit 47. Next, mounting head 42 lowers component mounting tool 43 so that the connecting section of the electronic component to be collected is immersed in the conductive adhesive. As a result, the conductive adhesive is applied to the connecting section. Mounting head 42 holding multiple component mounting tools 43 lowers component mounting tools 43 one by one to perform the application work.

Next, mounting head 42 moves above component camera 48. Component camera 48 captures an image of the electronic component collected in component mounting tool 43 from below, and acquires the image data. The acquired image data is subjected to image processing to determine the collection posture of the electronic component and the acceptability of the attached state of the conductive adhesive.

When it is determined that the electronic component is defective, mounting head 42 performs a retry operation or a discard operation of the electronic component determined to be defective. When it is determined to be satisfactory, mounting head 42 moves above the molded object at the work position. Next, mounting head 42 lowers component mounting tool 43, so that the electronic component to which the conductive adhesive is applied is mounted on the circuit pattern. Thus, the mounting work of the electronic component using the second application method of the conductive adhesive together is finished.

The control device (not shown) holds three-dimensional shape data including multiple layer data. The three-dimensional shape data includes not only data on an outer shape of the molded object but also data on the electronic circuit included in the molded object. Examples of the data related to electronic circuits include information such as the arrangement, wire width, and wire thickness of wires constituting a circuit pattern, a component mounting position on the circuit pattern, the type, shape, size, and arrangement of connecting sections of electronic components.

The control device associates and controls the operations of three-dimensional molding device 2, circuit forming device 3, component mounting device 4, pallet conveyance device 5, and component conveyance device 6. The control device may be a collection of individual control sections provided in the multiple devices. The function of control device for controlling the manufacture of the molded object will be described later.

2. Annular Sensor 9 as Example of Molded Object Fr

Figure 2:
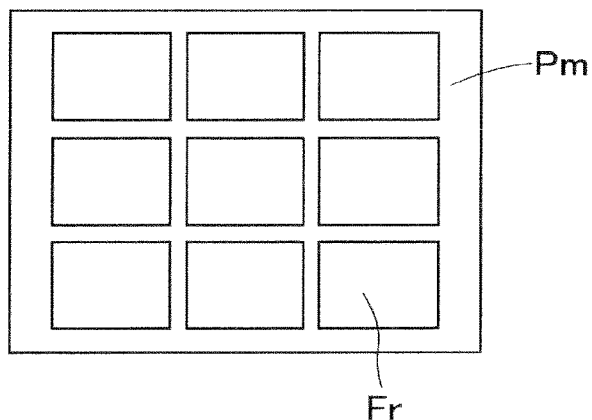
FIG. 2 is a plan view showing an example of arrangement of a molded object on a molding pallet.

One or more molded objects Fr are manufactured on molding pallet Pm. In the arrangement example shown in FIG. 2, nine molded objects Fr are disposed 3×3 on molding pallet Pm and manufactured at a time. Nine molded objects Fr may all be the same article, some of them may be the same article, or all may have different shapes. Accordingly, three-dimensional molding machine 1 is suitable for applications such as collective production of many types of products, simultaneous production of multiple prototypes having slightly different designs, and the like. In these applications, the number of types of electronic components to be supplied using component tray Ty increases.

Figure 3:
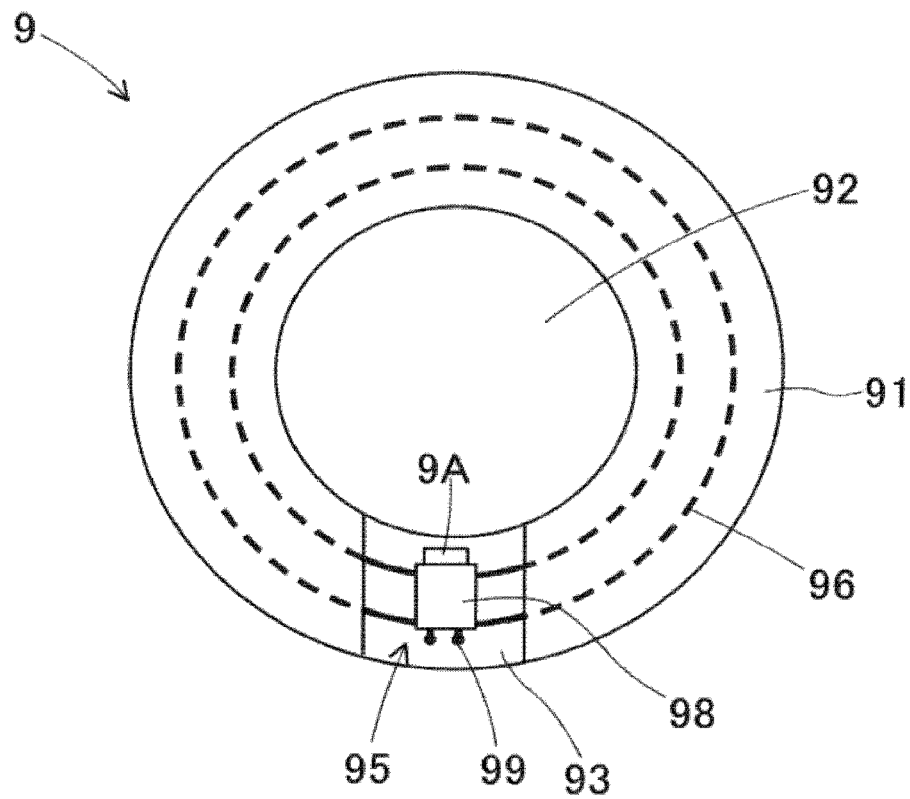
FIG. 3 is a plan view of an annular sensor, which is an example of a molded object.
Figure 4:
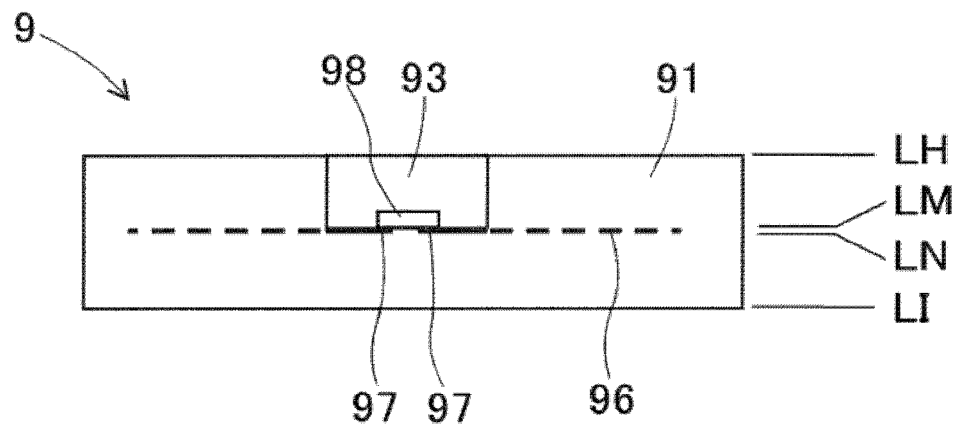
FIG. 4 is a front view of the annular sensor.

As an example of molded object Fr, a configuration of annular sensor 9 for detecting a magnetic field and a method of manufacturing the same will be described. As shown in FIG. 3 and FIG. 4, annular sensor 9 includes annular base portion 91 having hollow portion 92, and electronic circuit 95 included in base portion 91. A cross-section orthogonal to a circumferential direction of base portion 91 is rectangular, but the cross-section may be circular without limitation. A portion of the circumferential direction of base portion 91 has a thickness of approximately an upper half thereof omitted to form a circuit exposed portion 93.

Electronic circuit 95 is configured by circuit pattern 96 and two electronic components connected to circuit pattern 96. Circuit pattern 96 is buried in an intermediate height of base portion 91 and is exposed in circuit exposed portion 93. Circuit pattern 96 is formed of two concentric circular wires along the circumferential direction of base portion 91. Strictly speaking, circuit pattern 96 includes two arcuate wires having a center angle slightly smaller than 360°, and having both ends at the position of circuit exposed portion 93. A total of four end portions of circuit pattern 96 constitute component mounting position 97.

The electronic component includes detection component 98 and battery 9A. Detection component 98 is connected to an upper side of four component mounting positions 97 of circuit pattern 96. Detection component 98 detects a magnitude of a magnetic field linked to annular circuit pattern 96 using electromagnetic induction action. Detection component 98 has a rectangular plate-like outer shape and has pair of output terminals 99. By disposing detection component 98 in circuit exposed portion 93, an output signal of output terminal 99 can be extracted to the outside using an output line.

Battery 9A is mounted at a position closer to detection component 98. Battery 9A is directly connected to a power supply terminal (not shown) of detection component 98 to supply power to detection component 98. Battery 9A is disposed in circuit exposed portion 93 so as to be exchangeable at the time of consumption. Detection component 98 and battery 9A are supplied from component tray Ty on component pallet Pp.

Accordingly, when only annular sensor 9 is manufactured, detection component 98 is held in twenty component trays Ty on component pallet Pp, and battery 9A is held in other twenty component trays Ty. In addition, feeder-type component supplying unit 45 is placed in a halt state. In order to manufacture nine annular sensors 9 on one molding pallet Pm, only nine detection components 98 and battery 9A are consumed, so that frequency of component shortage is low. In other words, the frequency of -out and re-in of component pallet Pp is low.

Here, it is assumed that a tray-type component supplying device having a conventional configuration is applied. The tray-type component supplying device having a conventional configuration raises or lowers and selects component tray Ty holding detection component 98 and component tray Ty holding battery 9A, and pulls out one component tray Ty to a component supplying position to perform a component supply action. Therefore, it is necessary to replace component tray Ty pulled out for each molding pallet Pm, and thus, the production efficiency is low. In the conventional configuration, when the number of types of electronic components to be supplied using component tray Ty is further increased, the decrease in the production efficiency becomes more remarkable.

On the other hand, in three-dimensional molding machine 1 according to the embodiment, since component conveyance device 6 uses component pallet Pp for supplying multiple types of electronic components, the frequency of replacement of component tray Ty is reduced, and thus, the production efficiency is enhanced. In addition, since the configuration of component conveyance device 6 is simplified as compared with the case where a raising/lowering mechanism and a pull-out mechanism are required in the conventional configuration, it is also advantageous in terms of facility cost.

The control device holds three-dimensional shape data of annular sensor 9. The three-dimensional shape data includes lowermost first layer data L1 to uppermost layer data LH located on the uppermost side shown in FIG. 4. Hereinafter, descriptions will be made in order from the lower layer data.

First layer data L1 to (N−1)th layer data are the same as each other and represent a planar cross-sectional shape of an annular shape that does not include circuit exposed portion 93 of base portion 91. Nth layer data LN to (M−1)th layer data are the same as each other and represent the C-shaped horizontal cross-sectional shape that circuit exposed portion 93 of base portion 91 has, and the shape of circuit pattern 96 to be embedded. Mth layer data LM represents component mounting position 97 at which detection component 98 and battery 9A are mounted, in addition to the C-shaped horizontal cross-sectional shape that circuit exposed portion 93 of base portion 91 has. (M+1)th layer data to uppermost layer data LH are the same as each other and represent a C-shaped horizontal cross-sectional shape that circuit exposed portion 93 of base portion 91 has.

3. Operation of Three-Dimensional Molding Machine 1 According to Embodiment

Figure 5:
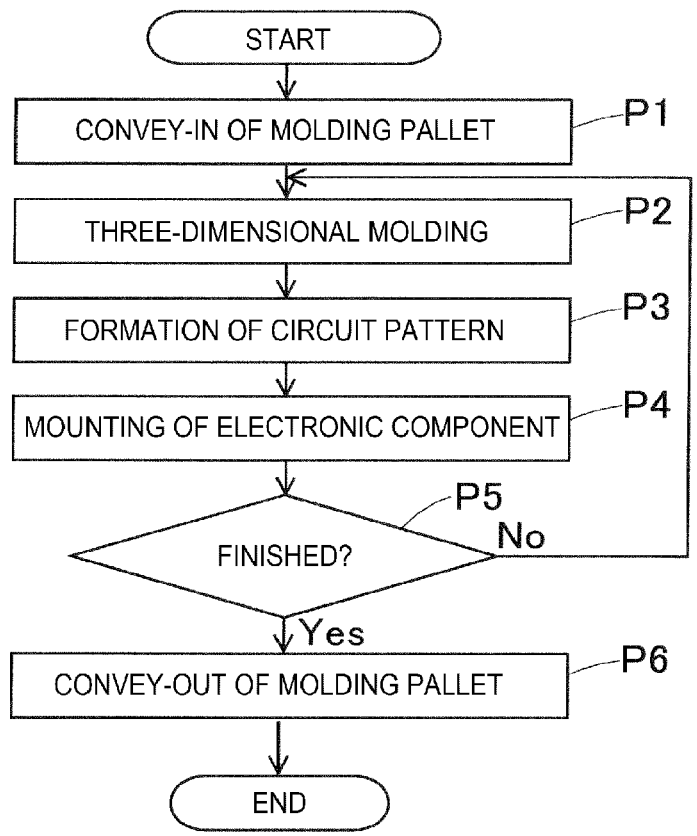
FIG. 5 is a manufacturing process diagram of the molded object using the three-dimensional molding machine.
Figure 6:
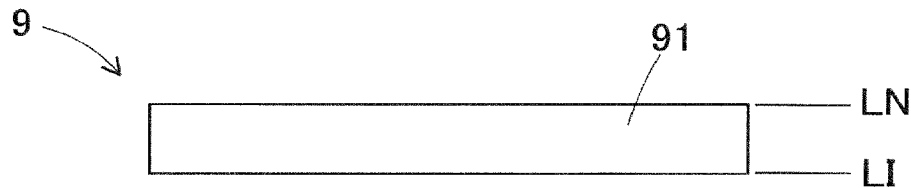
FIG. 6 is a front view showing a state in which a substantially lower half of the annular sensor is molded.
Figure 7:
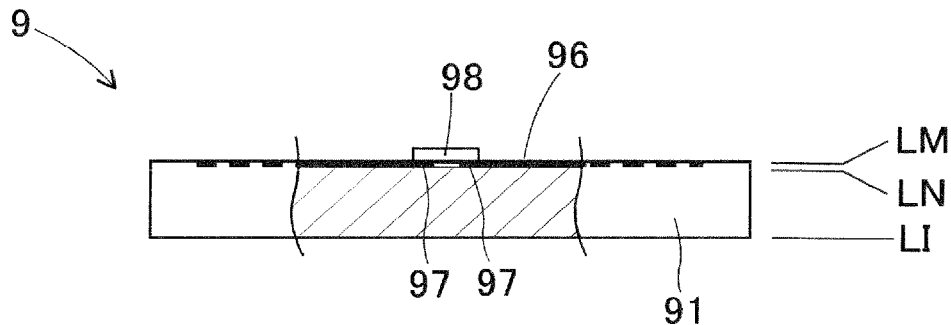
FIG. 7 is a front partial cross-sectional view showing a state in which an electronic circuit included in the annular sensor is formed.

Next, an operation when three-dimensional molding machine 1 manufactures annular sensor 9 will be described with reference to FIGS. 5 to 7. A manufacturing process diagram shown in FIG. 5 includes six steps from first step P1 to sixth step P6. The manufacturing process diagram is executed by control from the control device.

In first step P1, pallet conveyance device 5 conveys in molding pallet Pm from -in end 53. Hereafter, detailed descriptions of the operation of pallet conveyance device 5 for conveying molding pallet Pm in the machine will be omitted without complication. The control device controls so as to repeat second step P2 to fifth step P5 for each layer data, referring to the lower layer data in order. It should be noted that not all of second step P2, third step P3, and fourth step P4 are executed in the repetition. Actually, either one step only or two steps are often executed.

In second step P2, three-dimensional molding device 2 is operated to mold annular sensor 9 on molding pallet Pm by the minute height dimension. In next third step P3, circuit forming device 3 is operated to form circuit pattern 96 on annular sensor 9 during molding. In next fourth step P4, component mounting device 4 is operated to mount detection component 98 and battery 9A on component mounting position 97 of circuit pattern 96.

In next fifth step P5, the control device determines whether the control for referring to uppermost layer data LH is finished. When not finished, the control device advances the layer data to be referenced to the upper side by one, and returns the execution of the control to second step P2. When the control for referring to uppermost layer data LH is finished and the manufacture of annular sensor 9 is finished, the control device advances the execution of the control to sixth step P6. In sixth step P6, pallet conveyance device 5 carries out annular sensor 9 together with molding pallet Pm from convey-out end 54. This completes one cycle of manufacturing annular sensor 9.

In manufacturing annular sensor 9, only the second step is repeatedly executed while first layer data L1 to (N−1)th layer data are referenced. As a result, as shown in FIG. 6, a substantially lower half of base portion 91 is molded. In addition, the second step and the third step are repeatedly executed while Nth layer data LN to (M−1)th layer data are referenced. As a result of this repetition, as shown in FIG. 7, circuit pattern 96 is formed in base portion 91.

Further, when Mth layer data LM is referenced, the second step and the fourth step are executed. Through this fourth step, detection component 98 and battery 9A are mounted on component mounting position 97 on circuit pattern 96 (refer to FIG. 7). In addition, only the second step is repeatedly executed while (M+1)th layer data to uppermost layer data LH are referenced. As a result, a substantially upper half of base portion 91 including circuit exposed portion 93 is molded, and thus, circuit pattern 96 is embedded. Through the above steps, annular sensor 9 is completed.

According to three-dimensional molding machine 1 of the embodiment, the molding of the molded object (annular sensor 9), the formation of circuit pattern 96, and the mounting of the electronic components (detection component 98 and battery 9A) are performed by each device (2, 3, 4) in the machine, and the conveyance of the molded object between the devices and the -in of the electronic components from the outside of the machine are performed using the two sets of conveyance devices (5, 6). Accordingly, it is possible to manufacture the molded object including electronic circuit 95 with high production efficiency without requiring a great deal of effort.

4. Mode of Component Mounting Machine

In addition, component mounting machine 8 (refer to FIG. 1) can be configured by combining left-right conveyance unit 51, component conveyance device 6, and component mounting device 4. Component mounting machine 8 is incorporated in three-dimensional molding machine 1, or is configured separately from three-dimensional molding machine 1. Separate component mounting machine 8 may be a mounting target object such as a thin plate-shaped substrate on which a circuit pattern is formed, in addition to the above-described molded object.

Separate component mounting machine 8 includes left-right conveyance unit 51 serving as the target object conveyance device configured to in and out the mounting target object on which a circuit pattern is formed, component conveyance device 6 configured to in component pallet Pp on which multiple component trays Ty configured to hold multiple types of electronic components for each type are placed, and component mounting device 4 serving as component transferring device configured to collect electronic components from component tray Ty conveyed in by component conveyance device 6 and mount the electronic components on the circuit pattern of the mounting target object conveyed in by the target object conveyance device.

In component mounting machine 8 and three-dimensional molding machine 1, component pallet Pp on which multiple component trays Ty for holding multiple types of electronic components for each type are placed is used. Therefore, the replacement of component tray Ty or component pallet Pp may be performed only when the component runs out, and thus, multiple types of electronic components can be efficiently supplied from one component pallet Pp.

5. Application and Modification of Embodiment

In the embodiment, three-dimensional molding machine 1 is configured by integrating molding block 1R and mounting block 1L, but is not limited to this. For example, pallet conveyance device 5 can be configured to be linear by arranging three-dimensional molding device 2, circuit forming device 3, and component mounting device 4 in a row. The internal arrangement of the constituent elements constituting each of three-dimensional molding device 2, circuit forming device 3, and component mounting device 4 can be appropriately changed. In addition, the molding by three-dimensional molding device 2 may be performed by a method or a raw material other than those described in the embodiment. Circuit forming device 3 may use a forming method other than the drawing operation by drawing head 32 and inkjet nozzle 33. The embodiment may be variously applied or modified.

REFERENCE SIGNS LIST

1: three-dimensional molding machine, 2: three-dimensional molding device, 22: molding head, 23: molding nozzle, 26: smoothing unit, 27: ultraviolet ray irradiating unit, 3: circuit forming device, 32: drawing head, 33: inkjet nozzle, 36: firing unit, 4: component mounting device, 41: moving gantry, 42: mounting head, 43: component mounting tool, 44: applicator, 5: pallet conveyance device, 51: left-right conveyance unit, 55: front-rear conveyance unit, 6: component conveyance device, 61: -in/out port, 8: component mounting machine, 9: annular sensor, 91: base portion, 95: electronic circuit, 96: circuit pattern, 97: component mounting position, 98: detection component, 9A: battery, Fr: molded object, Pm: molding pallet, Pp: component pallet, Ty: component tray

The invention claimed is:
1. A three-dimensional molding machine comprising:
a molding block, including:
a three-dimensional molding device configured to mold a three-dimensional molded object on a molding pallet;
a circuit forming device configured to form a circuit pattern on the molded object during or after molding; and
a first pallet conveyance unit configured to convey the molded object together with the molding pallet in a first direction between the three-dimensional molding device and the circuit forming device; and a mounting block adjacent to the molding block in a second direction orthogonal to the first direction, including:
  a component mounting device configured to mount electronic components on the circuit pattern formed on the molded object; and
  a component conveyance device configured to convey the electronic components into the component mounting device from an outside of the three-dimensional molding machine; and
a second pallet conveyance unit configured to convey the molding pallet in the second direction over a rear portion of the molding block and a rear portion of the mounting block each referenced in the first direction, the second pallet conveyance unit including an entry end where the molding pallet enters the three-dimensional molding machine at a side of the molding block opposite to the mounting block and an exit end where the molding pallet exits the three-dimensional molding machine at a side of the mounting block opposite to the molding block in the second direction.

2. The three-dimensional molding machine according to claim 1, wherein the component conveyance device conveys in a component pallet on which multiple component trays configured to hold multiple types of the electronic components for each type are placed.

3. The three-dimensional molding machine according to claim 1, wherein each of the first pallet conveyance unit and the component conveyance device is a conveyor device having a conveyor belt that rotates.

4. The three-dimensional molding machine according to claim 1, wherein the circuit forming device is a drawing device configured to draw the circuit pattern on the molded object using conductive ink.

5. The three-dimensional molding machine according to claim 1, wherein the component mounting device includes
  a mounting head configured to exchangeably hold an applicator configured to apply a conductive material in a paste form to a component mounting position of the circuit pattern, and a component mounting tool that collects the electronic components and mounts the electronic components on the conductive material, or
  a mounting head configured to hold both the applicator and the component mounting tool.

6. The three-dimensional molding machine according to claim 2, wherein the component mounting device includes
  a target object conveyance device configured to in and out a mounting target object on which a circuit pattern is formed; and a component transferring device configured to collect the electronic components from the component trays conveyed in by the component conveyance device, and mount the electronic components on the circuit pattern of the mounting target object conveyed in by the target object conveyance device.

7. The three-dimensional molding machine according to claim 6, wherein each of the target object conveyance device and the component conveyance device is a conveyor device having a conveyor belt that rotates.

8. The three-dimensional molding machine according to claim 6, wherein the component transferring device includes
  a mounting head configured to exchangeably hold an applicator configured to apply a conductive material in a paste form to a component mounting position of the circuit pattern, and a component mounting tool that collects the electronic components and mounts the electronic components on the conductive material, or
  a mounting head configured to hold both the applicator and the component mounting tool.

9. The three-dimensional molding machine according to claim 1, further comprising a branching portion that conveys the molding pallet between the first pallet conveyance unit and the second pallet conveyance unit.

10. The three-dimensional molding machine according to claim 9, wherein
  the first pallet conveyance unit is a first pallet conveyor belt,
  the second pallet conveyance unit is a second pallet conveyor belt, and
  the component mounting device is arranged along the second pallet conveyor belt between the branching portion and the exit end.

11. The three-dimensional molding machine according to claim 9, wherein
  the branching portion is located at an intersection of the first pallet conveyance unit and the second pallet conveyance unit between the entry end and the exit end in the second direction.

* * * * *